United States Patent
Suzuki

(10) Patent No.: US 10,170,887 B2
(45) Date of Patent: Jan. 1, 2019

(54) SURFACE EMITTING LASER ELEMENT AND ATOMIC OSCILLATOR

(71) Applicant: Ryoichiro Suzuki, Miyagi (JP)

(72) Inventor: Ryoichiro Suzuki, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 176 days.

(21) Appl. No.: 15/216,834

(22) Filed: Jul. 22, 2016

(65) Prior Publication Data

US 2017/0040771 A1  Feb. 9, 2017

(30) Foreign Application Priority Data

Aug. 6, 2015 (JP) ................................. 2015-155956

(51) Int. Cl.
*H01S 5/068* (2006.01)
*H01S 5/00* (2006.01)
(Continued)

(52) U.S. Cl.
CPC ............ *H01S 5/068* (2013.01); *H01S 5/0042* (2013.01); *H01S 5/183* (2013.01); *H01S 5/187* (2013.01);
(Continued)

(58) Field of Classification Search
CPC ....... H03L 7/26; H03L 5/068; H03L 5/34313; H03L 5/34386; H03L 5/423; H01S 5/068;
(Continued)

(56) References Cited

U.S. PATENT DOCUMENTS 8,705,585 B2   4/2014  Sato et al.
8,971,372 B2   3/2015  Suzuki et al.
(Continued)

FOREIGN PATENT DOCUMENTS

EP   2690725 A2   1/2014
EP   2808958 A2   12/2014
(Continued)

OTHER PUBLICATIONS

Svenja Knappe, "MEMS Atomic Clocks", Comprehensive Microsystems, vol. 3, pp. 571-612.
Darwin K. Serkland et al., "VCSELs for Atomic Clocks", Proc. of SPIE, vol. 6132, 613208.
European search report dated Jan. 3, 2017 in corresponding European Patent Application No. 16182243.2.

*Primary Examiner* — Arnold Kinkead
(74) *Attorney, Agent, or Firm* — Cooper & Dunham LLP

(57) ABSTRACT

A surface emitting laser element includes a lower Bragg reflection mirror; an upper Bragg reflection mirror; and a resonator region formed between the lower Bragg reflection mirror and the upper Bragg reflection mirror, and including an active layer. A wavelength adjustment region is formed in the lower Bragg reflection mirror or the upper Bragg reflection mirror, and includes a second phase adjustment layer, a wavelength adjustment layer and a first phase adjustment layer, arranged in this order from a side where the resonator region is formed. An optical thickness of the wavelength adjustment region is approximately $(2N+1)\times\lambda/4$, and the wavelength adjustment layer is formed at a position where an optical distance from an end of the wavelength adjustment region on the side of the resonator region is approximately $M\times\lambda/2$, where $\lambda$ is a wavelength of emitted light, M and N are positive integers, and M is N or less.

12 Claims, 6 Drawing Sheets

(51) Int. Cl.
*H01S 5/187* (2006.01)
*H03L 7/26* (2006.01)
*H01S 5/183* (2006.01)
*H01S 5/20* (2006.01)
*H01S 5/343* (2006.01)

(52) U.S. Cl.
CPC ...... *H01S 5/18358* (2013.01); *H01S 5/18361* (2013.01); *H03L 7/26* (2013.01); *H01S 5/18313* (2013.01); *H01S 5/18377* (2013.01); *H01S 5/2086* (2013.01); *H01S 5/34313* (2013.01); *H01S 5/34386* (2013.01); *H01S 2301/163* (2013.01); *H01S 2301/176* (2013.01)

(58) Field of Classification Search
CPC ... H01S 5/187; H01S 5/14; H01S 5/40; H01S 5/42; H01S 5/18313; H01S 5/18358; H01S 5/18361; H01S 5/183; G04F 5/145
USPC .......... 331/94.1, 3; 372/45.01, 50.11, 50.124
See application file for complete search history.

(56) References Cited

U.S. PATENT DOCUMENTS

| | | | |
|---|---|---|---|
| 9,225,149 | B2 | 12/2015 | Suzuki et al. |
| 2014/0023104 | A1 | 1/2014 | Suzuki et al. |
| 2014/0354366 | A1* | 12/2014 | Suzuki ................. H01S 5/0421 |
| | | | 331/94.1 |
| 2014/0354367 | A1 | 12/2014 | Suzuki et al. |
| 2015/0180205 | A1* | 6/2015 | Kaneko .................... H03L 7/26 |
| | | | 372/45.01 |

FOREIGN PATENT DOCUMENTS

| | | |
|---|---|---|
| JP | 2006-302955 | 11/2006 |
| JP | 2006-351692 A | 12/2006 |
| JP | 2008-053353 | 3/2008 |
| JP | 2009-188598 | 8/2009 |
| JP | 2013-138176 | 7/2013 |

* cited by examiner

SURFACE EMITTING LASER ELEMENT AND ATOMIC OSCILLATOR

CROSS-REFERENCE TO RELATED APPLICATIONS

The present application claims benefit of priority under 35 U.S.C. § 119 of Japanese Patent Application No. 2015-155956, filed Aug. 6, 2015. The contents of this application are incorporated herein by reference in their entirety.

BACKGROUND OF THE INVENTION

1. Field of the Invention

The disclosures herein generally relates to a surface emitting laser element and an atomic oscillator.

2. Description of the Related Art

A vertical cavity surface emitting LASER (VCSEL) is a semiconductor laser, which emits light in a direction perpendicular to a substrate surface. The VCSEL has a feature, compared with an end-face emitting type semiconductor laser, of low cost, of low power consumption, small size, high performance, and being easily integrated two-dimensionally.

The vertical cavity surface emitting laser has a resonator structure that has a resonator region including an active layer, and upper and lower Bragg reflection mirrors provided above and below the resonator region, respectively (See Japanese Published Patent Application No. 2008-53353). The resonator region has a predetermined optical thickness so that light with wavelength of λ resonates in the resonator region in order to obtain light with an oscillation wavelength of λ. The upper and lower Bragg reflection mirrors are formed by DBRs (Distributed Bragg Reflector) formed by laminating materials having different refraction indices, i.e. a low refraction index material and a high refraction index material, alternately. In the DBR, the low and high refraction index materials are formed so that optical thicknesses are λ/4 taking account of the refraction indices of the respective materials, in order to obtain high reflectance where the wavelength is λ.

SUMMARY OF THE INVENTION

It is a general object of at least one embodiment of the present invention to provide a surface emitting laser element and an atomic oscillator that substantially obviate one or more problems caused by the limitations and disadvantages of the related art.

In one embodiment, a surface emitting laser element includes a lower Bragg reflection mirror; an upper Bragg reflection mirror; and a resonator region formed between the lower Bragg reflection mirror and the upper Bragg reflection mirror, and including an active layer. A wavelength adjustment region is formed in the lower Bragg reflection mirror or the upper Bragg reflection mirror. The wavelength adjustment region includes a second phase adjustment layer, a wavelength adjustment layer and a first phase adjustment layer, arranged in this order from a side where the resonator region is formed. An optical thickness of the wavelength adjustment region is approximately $(2N+1) \times \lambda/4$, and the wavelength adjustment layer is formed at a position where an optical distance from an end of the wavelength adjustment region on the side where the resonator region is formed is approximately $M \times \lambda/2$, where λ is a wavelength of emitted light, M and N are positive integers, and M is less than or equal to N.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

In the following, an embodiment of the present invention will be described with reference to the accompanying drawings. In addition, the same numerical symbols are assigned to the same members, and duplicate explanation will be omitted.

First Embodiment

Incidentally, a VCSEL that is a surface emitting laser element is formed by causing semiconductor layer to be epitaxially grown on a crystal substrate. For the epitaxial growth of the semiconductor layer MOCVD (Metal Organic Chemical Vapor Deposition), MBE (Molecular Beam Epitaxy) or the like is used. In the semiconductor film formed by the epitaxial growth in this way, in the case of MOCVD, for example, depending on a distribution of gas or a distribution of temperature of a wafer upon performing the epitaxial growth, a film thickness of the semiconductor film on a surface of the wafer may be non-uniform. When a resonator or a DBR of a surface emitting laser element is formed by the semiconductor film, a film thickness of which is non-uniform in this way, a variation occurs in oscillation wavelengths of surface emitting laser elements within a wafer. Then, a number of the surface emitting laser elements with the desired oscillation wavelength obtained from a wafer may become smaller.

Figure 1:
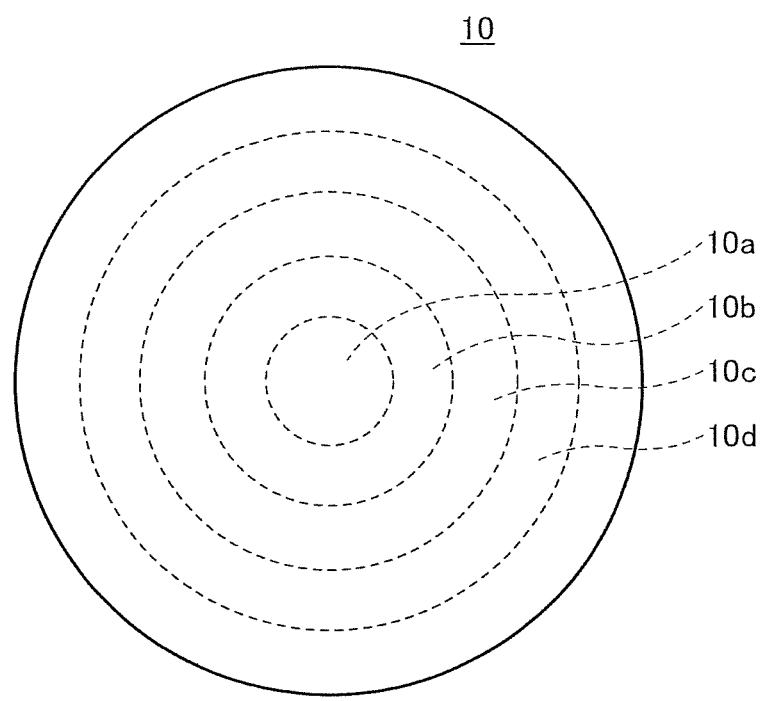
FIG. 1 is an explanatory diagram depicting an example of a film thickness distribution of a semiconductor layer formed on a wafer.

For example, assume that the case of causing a semiconductor film to be epitaxially grown by MOCVD. In this case, as illustrated in FIG. 1, a film thickness distribution, in which a film thickness of a region 10a that is a central portion of the wafer 10 is thick and, with distance from the central portion, the thickness becoming less in order of a region 10b, a region 10c, and a region 10d, may occur. Therefore, when surface emitting laser elements are prepared with the same condition, oscillation wavelengths of a surface emitting laser element in the region 10a, a surface emitting laser element in the region 10b, a surface emitting laser element in the region 10c, and a surface emitting laser element in the region 10d are different from each other. That is, when the oscillation wavelength of the surface emitting laser element prepared in the region 10a of the wafer 10 is the desired wavelength, the oscillation wavelength of the surface emitting laser element prepared in the region 10d is far from the desired wavelength. Therefore, in a usage where an oscillation wavelength of an atomic oscillator or the like needs to be exact, the surface emitting laser element in the region 10a of the wafer 10, an oscillation wavelength of which is exactly the desired wavelength, can be used. However, the surface emitting laser elements in the region 10b, the region 10c, and the region 10d cannot be used. In this way, a number of surface emitting laser elements, that can be used where an oscillation wavelength of an atomic oscillator or the like needs to be exact, obtained from a wafer 10 is small, which leads to an increase in cost or the like. Therefore, producing surface laser emitting elements that can be used where an oscillation wavelength of an atomic oscillator or the like needs to be exact with high yield is desired.

(Surface Emitting Laser Element)

A surface emitting laser element according to a first embodiment will be explained with reference to FIG. 2. The surface emitting laser element according to the embodiment is a surface emitting laser element where the oscillation wavelength is 894.6 nm, and formed by laminating semiconductor layers on a substrate 101. Specifically, the surface emitting laser element is formed by laminating in order, on the substrate 101, a lower Bragg reflection mirror 102, a lower spacer layer 103, an active layer 104, an upper spacer layer 105, a second upper Bragg reflection mirror 106, a first upper Bragg reflection mirror 107, and a contact layer 109. In the surface emitting laser element according to the embodiment, laser light is emitted from a surface of a layer which is laminated on a surface of the substrate 101.

The substrate 101 is formed by an n-GaAs substrate that is a semiconductor substrate. The lower Bragg reflection mirror 102 is a lower DBR, and is formed by alternately laminating 35.5 pairs of a high refraction index layer of n-$Al_{0.1}Ga_{0.9}As$ (aluminum gallium arsenide) and a low refraction index layer of n-$Al_{0.9}Ga_{0.1}As$, each layer having an optical thickness of $\lambda/4$.

The lower spacer layer 103 is formed of $Al_{0.2}Ga_{0.8}As$. The active layer 104 is formed of a quantum well structure including a quantum well layer of GaInAs (indium gallium arsenide)/a barrier layer of GaInPAs (indium gallium arsenide phosphide). In the embodiment, a resonator region 110 having a film thickness of a wavelength ($1\lambda$) is formed by the lower spacer layer 103, the active layer 104 and the upper space layer 105. The second upper Bragg reflection mirror 106 and the first upper Bragg reflection mirror 107 are formed by alternately laminating 5 pairs of a high refraction index layer of p-$Al_{0.1}Ga_{0.9}As$ and a low refraction index layer of p-$Al_{0.9}Ga_{0.1}As$, each layer having an optical thickness of $\lambda/4$.

In the embodiment, a wavelength adjustment region 120 is formed between the second upper Bragg reflection mirror 106 and the first upper Bragg reflection mirror 107. Therefore, in the embodiment, a region including the second upper Bragg reflection mirror 106, the wavelength adjustment region 120 and the first upper Bragg reflection mirror 107 will be described as an upper Bragg reflection mirror. The upper Bragg reflection mirror will serve as an upper DBR.

Moreover, in the middle of the second upper Bragg reflection mirror 106, an electric current narrowing layer 108 formed of p-AlAs is arranged. The electric current narrowing layer 108 has an electric current narrowing structure in which a selectively oxidized region 108a is formed by oxidizing a surrounding portion of the electric current narrowing layer 108, and the unoxidized central portion serves as an electric current narrowing region 108b.

The contact layer 109 is formed of p-GaAs. Above the contact layer 109, an upper electrode 111 is formed. Moreover, on the back side of the substrate 101, a lower electrode 112 is formed. In the surface emitting laser element according to the embodiment, a mesa is formed by removing a part of the semiconductor layers. In order to protect a side surface of the semiconductor layers that are exposed by forming a mesa, a protection layer 151 formed of a dielectric film such as SiN (silicon nitride) is provided. Furthermore, in the region where the semiconductor layers are removed upon forming the mesa, a resin material such as polyimide is put, and thereby a resin layer 152 is formed.

In the embodiment, the wavelength adjustment region 120 is arranged between the second upper Bragg reflection mirror 106 and the first upper Bragg reflection mirror 107. A high refraction index layer in the upper Bragg reflection layer is replaced by the wavelength adjustment region 120.

Figure 3:
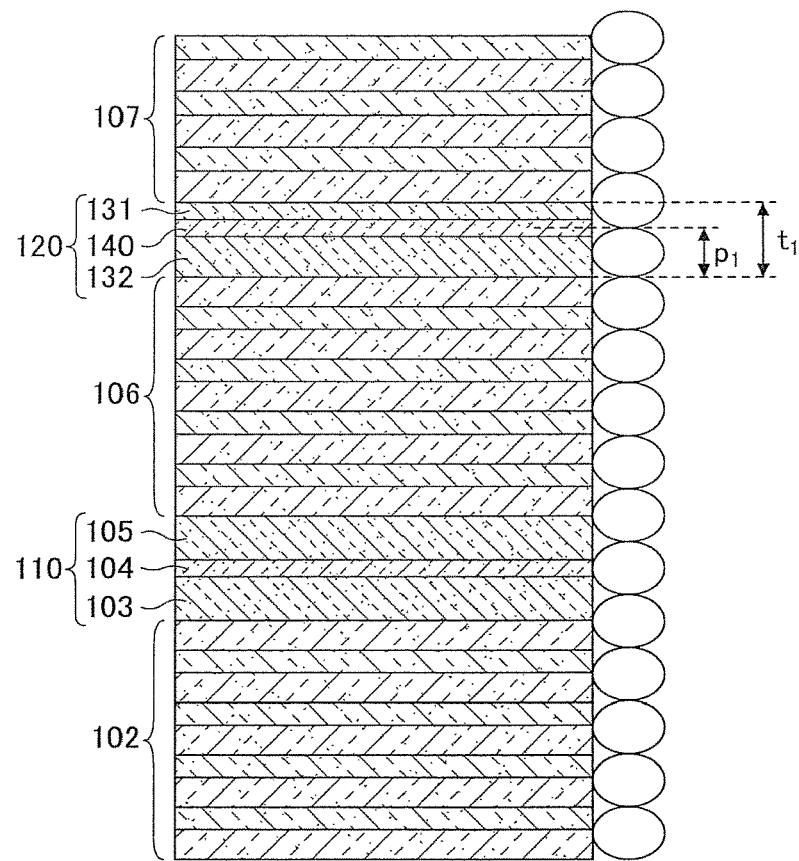
FIG. 3 is a structure diagram depicting an example of a main part of the surface emitting laser element according to the first embodiment.
Figure 4:
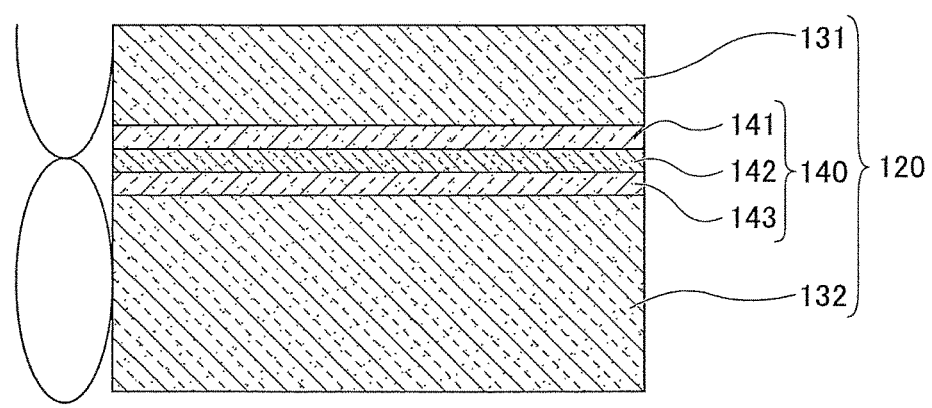
FIG. 4 is an explanatory diagram depicting an example of a wavelength adjustment region of the surface emitting laser element according to the first embodiment.

As illustrated in FIGS. 3 and 4, the wavelength adjustment region 120 is formed on the second upper Bragg reflection mirror 106, i.e. from the side of the resonator region 110, a second phase adjustment layer 132, a wavelength adjustment layer 140 and a first phase adjustment layer 131 are formed in this order. In addition, in FIG. 3, the electric current narrowing layer 108 formed in the second upper Bragg reflection mirror 106 is omitted. The wavelength adjustment layer 140 adjusts an oscillation wavelength in the surface emitting laser element. In the embodiment, up to three layers of the wavelength adjustment layer 140 are provided. The wavelength adjustment layer 140 is formed by alternately laminating two kinds of semiconductor materials, etching conditions of which are different from each other. In the embodiment, as illustrated in FIG. 4, the wavelength adjustment layer 140 is formed by alternately laminating $p^{++}$-GaInP and $p^{++}$-GaAsP. Specifically, in the wavelength adjustment layer 140, a third adjustment layer 143 formed of $p^{++}$-GaInP, a second adjustment layer 142 formed of $p^{++}$-GaAsP, and a first adjustment layer 141 formed of $p^{++}$-GaInP are laminated in order. In the embodiment, in the wavelength adjustment layer 140, as an impurity element, zinc (Zn) is doped with a density of $1\times10^{18}$ $cm^{-3}$ or more.

In the embodiment, by changing the number of layers in the wavelength adjustment layer 140, an optical thickness in the wavelength adjustment region 120 can be changed for each surface emitting laser element. Therefore, the ratio of surface emitting laser elements, an oscillation wavelength of which is the desired wavelength, obtained from a wafer can be increased, and the yield can be improved.

Here, assume the case where the wavelength adjustment layer 140 is formed by three layers of the third adjustment layer 143, the second adjustment layer 142 and the first adjustment layer 141. In this case, if film thicknesses are uniform, an oscillation wavelength in the case where the wavelength adjustment layer 140 is three adjustment layers is a wavelength λ1, an oscillation wavelength in the case where the wavelength adjustment layer 140 is two adjustment layers is a wavelength λ2, and an oscillation wavelength in the case where the wavelength adjustment layer 140 is one adjustment layer is a wavelength λ3. Moreover, in the case where the wavelength adjustment layer 140 is not formed, an oscillation wavelength is a wavelength λ4. In this way, by changing the number of layers in the wavelength adjustment layer 140, surface emitting laser elements, oscillation wavelength of which are different from each other, i.e. four different wavelengths, λ1, λ2, λ3 and λ4, are obtained.

In the surface emitting laser element, disclosed in Japanese Published Patent Application No. 2013-138176, in which a upper Bragg reflection mirror above a wavelength adjustment layer is formed of a dielectric material, a refraction index of a dielectric layer formed of a dielectric material is considerably less than a refraction index of the wavelength adjustment layer formed of a semiconductor material. Therefore, an interface between the wavelength adjustment layer and the dielectric layer is required to be formed at an antinode position in a longitudinal mode. If the interface between the wavelength adjustment layer and the dielectric layer is formed at a node position in a longitudinal mode, light is reflected in a reversed phase at the interface between the wavelength adjustment layer and the upper Bragg reflection mirror formed of a dielectric material.

Therefore, the inventor of the present application earnestly examined including experiments and the like regarding a surface emitting laser element having the structure where the upper Bragg reflection mirror above the wavelength adjustment layer is formed of a semiconductor material. As a result the inventor found that by forming so that an upper end of the wavelength adjustment region 120 is positioned at an antinode of a longitudinal mode and a lower end is positioned at a node of the longitudinal mode, and forming the wavelength adjustment layer 140 at a node position of the longitudinal mode in the wavelength adjustment region 120, as illustrated in FIG. 3, characteristics can be improved, such as reducing an oscillation threshold electric current, without degrading a wavelength adjustment function. The embodiment is based on the knowledge found by the inventor in this way.

Specifically, refraction indices of two semiconductor materials used in the wavelength adjustment layer 140, i.e. GaInP and GaAsP, are different from each other, i.e. 3.3 and 3.5. When the wavelength adjustment layer 140 is at a position of an antinode, a factor of scattering loss may occur. But, when the wavelength adjustment layer 140 is at a position of a node, an influence from the factor of scattering loss is suppressed.

Moreover, in the surface emitting laser element in which the upper Bragg reflection mirror above the wavelength adjustment layer 140 is formed of a semiconductor material, at an interface or the like between two kinds of layers forming the wavelength adjustment layer 140, due to a hetero spike or the like that occurs in a band structure, electric resistance increases. Therefore, in order to reduce the electric resistance and to increase electric conductivity, the method may include increasing the density of the impurity element doped in the wavelength adjustment layer 140.

However, when a region, in which the impurity element is doped with high density, is formed at an antinode position in the longitudinal mode in the wavelength adjustment region 120, there is a problem that light absorption becomes great in this region, the oscillation threshold electric current becomes higher and slope efficiency is reduced or the like. On the other hand, in the embodiment, the wavelength adjustment layer 140 is formed at a node position in the longitudinal mode. Therefore, even if the density of the impurity element doped in the wavelength adjustment layer 140 is increased, the electric resistance can be reduced without increasing the oscillation threshold electric current, reducing the slope efficiency or the like. In this way, in a surface emitting laser element, by reducing the electric resistance, heat generation from the surface emitting laser element is suppressed, and the maximum optical output of laser light emitted from the surface emitting laser element can be increased.

As described above, in the embodiment, the wavelength adjustment region 120 is formed in order of the second phase adjustment layer 132, the wavelength adjustment layer 140, and the first phase adjustment layer 131. Specifically, the second phase adjustment layer 132 and the first phase adjustment layer 131 are formed of p-$Al_{0.16}Ga_{0.84}As$. The wavelength adjustment layer 140 is formed of three layers of $p^{++}$-GaInP/$p^{++}$-GaAsP/$p^{++}$-GaInP. The wavelength adjustment region 120 is formed, as described above, between the second upper Bragg reflection mirror 106 and the first upper Bragg reflection mirror 107. A high refraction index layer in the upper Bragg reflection layer is replaced by the wavelength adjustment region 120.

Figure 2:
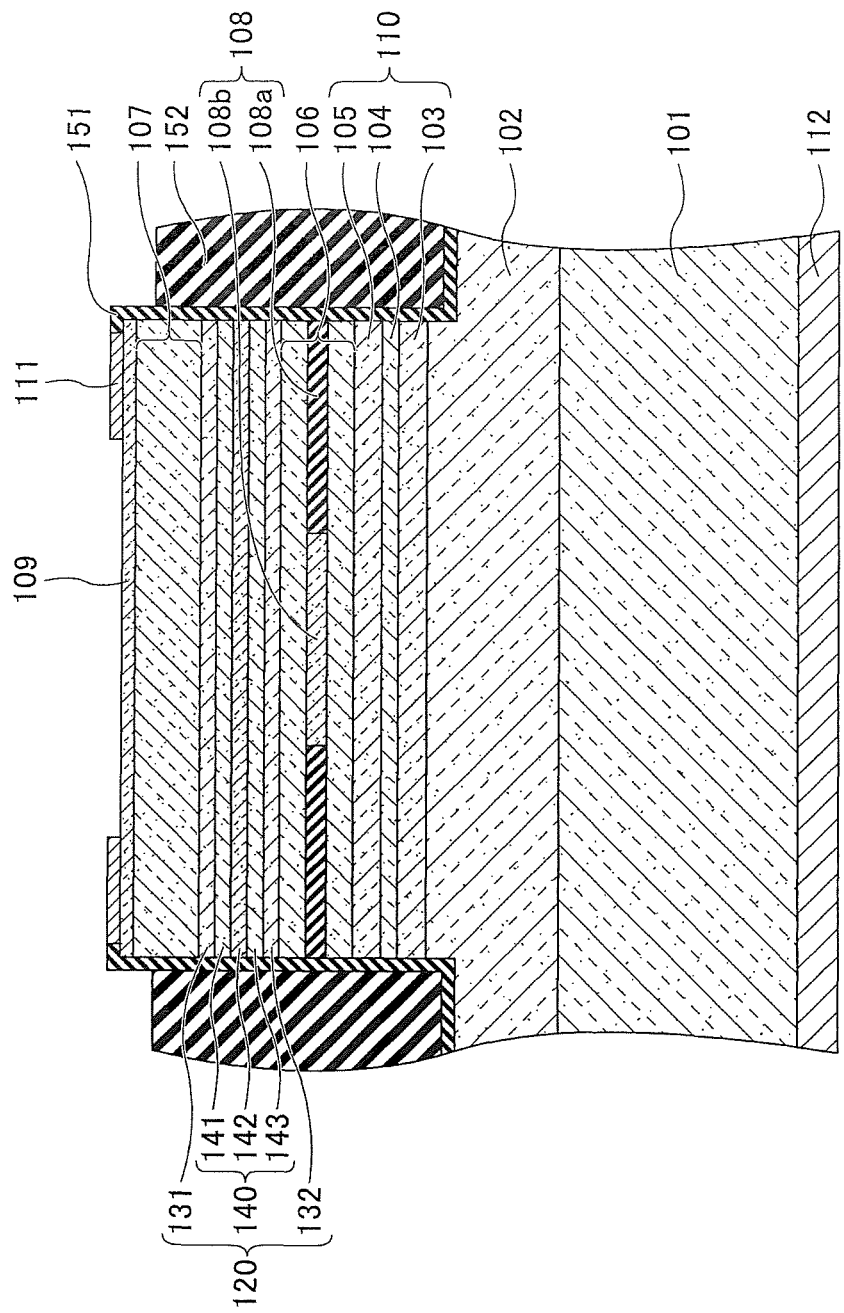
FIG. 2 is a structure diagram depicting an example of a surface emitting laser element according to a first embodiment.

As illustrated in FIG. 2, in the embodiment, the wavelength adjustment region 120 is formed so that an optical thickness $t_1$ of the entire wavelength adjustment region 120 is approximately 3λ/4. Moreover, in the wavelength adjustment region 120, an optical distance $p_1$ from a lower end of the wavelength adjustment region 120 to a center of the wavelength adjustment layer 140 is approximately λ/2. That is, when the wavelength adjustment layer 140 is formed by three layers of $p^{++}$-GaInP/$p^{++}$-GaAsP/$p^{++}$-GaInP, the optical distance $p_1$ to the center of the middle layer $p^{++}$-GaAsP is λ/2.

In addition, in the case of forming so that the optical thickness $t_1$ of the entire wavelength adjustment region 120 is approximately 5λ/4, the wavelength adjustment layer 140 has only to be formed at a position where the optical distance $p_1$ from the lower end of the wavelength adjustment region 120 is λ/2 or λ. Moreover, in the case of forming so that the optical thickness $t_1$ of the entire wavelength adjustment region 120 is approximately 7λ/4, the wavelength adjustment layer 140 has only to be formed at a position where the optical distance $p_1$ from the lower end of the wavelength adjustment region 120 is any one of λ/2, λ and 3λ/2.

That is, the optical thickness of the wavelength adjustment region 120 is approximately $(2N+1) \times \lambda/4$ (N=1, 2, ...), and the position of the wavelength adjustment layer 140 is from an end portion of the wavelength adjustment region 120 on the side of the resonator region 110, approximately $M \times \lambda/2$ (M=1, 2, ...) where M is less than or equal to N.

Moreover, in the embodiment, the wavelength adjustment layer 140 is formed so that an optical thickness of each of the three layers of $p^{++}$-GaInP/$p^{++}$-GaAsP/$p^{++}$-GaInP, forming the wavelength adjustment layer 140 is 0.05λ. Therefore, when a layer number of the adjustment layers in the wavelength adjustment layer 140 is changed, an interval of oscillation wavelengths in the surface emitting laser element is 1 nm. In the embodiment, a high refraction index layer in the upper Bragg reflection layer is replaced by the wavelength adjustment region 120. In this structure, compared with a structure described in a second embodiment being replaced by a low refraction index layer, which will be described later, a mixed crystal including Al can be prevented from being used as a material for the wavelength adjustment layer. Therefore, upon performing selective etching for respective layers of the wavelength adjustment layer, oxidation or corrosion of surfaces of the respective layers of the wavelength adjustment layer can be prevented, and thereby the reliability is improved.

(Manufacturing Method of Surface Emitting Laser Element)

When the surface emitting laser element according to the embodiment is manufactured, the semiconductor layer is formed by epitaxial growth according to MOCVD method, MBE method or the like. Specifically, on the substrate 101, the lower Bragg reflection mirror 102, the lower spacer layer 103, the active layer 104, the upper spacer layer 105, the second upper Bragg reflection mirror 106, the second phase adjustment layer 132, and three layers of the wavelength adjustment layer 140 are formed in order by a crystal growth. On this occasion, a resonance wavelength is measured on a wafer that is serving as the substrate 101. In addition, the electric current narrowing layer 108 is formed as a layer of the high refraction index layers forming the second upper Bragg reflection mirror 106.

Next, by performing repeatedly resist patterning and selective etching, in an area of the entire wafer as large as possible, the wavelength adjustment layer 140 is formed so that the layer number of the wavelength adjustment layer 140 is different for each area to make the resonance wavelength correspond to the desired wavelength.

For example, as illustrated in FIG. 1, in a film formation according to MOCVD, a film in a region 10a that is a central portion of the wafer 10 is thick, and with distance from the central portion the film becomes thinner in order of a region 10b, a region 10c, and a region 10d. In this case, for the sake of simplicity, assume that with reference to the surface emitting laser element formed in the region 10d of the wafer 10, the oscillation wavelength becomes longer by 1 nm in the region 10c, the oscillation wavelength becomes longer by 2 nm in the region 10b, and the oscillation wavelength becomes longer by 3 nm in the region 10a.

In this case, at first, photoresist is applied on a surface of the wafer 10, and exposure by an exposure device and developing are performed, and thereby a resist pattern having openings in the regions 10a, 10b, and 10c in the wafer 10 is formed. Afterwards, the first adjustment layer 141 of the wavelength adjustment layer 140 in the regions 10a, 10b and 10c of the wafer 10 in which a resist pattern is not formed is removed by wet etching. Furthermore, afterwards, the resist pattern is also removed by an organic solvent or the like.

Next, photoresist is applied on a surface of the wafer 10, and exposure by an exposure device and developing are performed, and thereby a resist pattern having openings in the regions 10a and 10b in the wafer 10 is formed. Afterwards, the second adjustment layer 142 of the wavelength adjustment layer 140 in the regions 10a and 10b of the wafer 10 in which a resist pattern is not formed is removed by wet etching. Furthermore, afterwards, the resist pattern is also removed by an organic solvent or the like.

Next, photoresist is applied on a surface of the wafer 10, and exposure by an exposure device and developing are performed, and thereby a resist pattern having an opening in the region 10a in the wafer 10 is formed. Afterwards, the third adjustment layer 143 of the wavelength adjustment layer 140 in the region 10a of the wafer 10 in which a resist pattern is not formed is removed by wet etching. Furthermore, afterwards, the resist pattern is also removed by an organic solvent or the like.

In the above-described wet etching, for example, for an etchant for GaAsP (the same is true as for GaAs), a mixed liquid of a sulfuric acid, a hydrogen peroxide and water may be used. Moreover, for an etchant for GaInP a mixed liquid of a hydrochloric acid and water may be used.

Therefore, in the region 10a in the wafer 10, all the three layers of the wavelength adjustment layer 140 are removed. Moreover, in the region 10b in the wafer 10, a layer of the wavelength adjustment layer 140 remains, in the region 10c in the wafer 10, two layers of the wavelength adjustment layer 140 remain, and in the region 10d in the wafer 10, three layers of the wavelength adjustment layer 140 remain.

In the embodiment, even if the semiconductor layer formed on the wafer 10 has a film thickness distribution, the wavelength adjustment layer 140 can be formed so that layer numbers of the wavelength adjustment layer 140 are different from each other. Therefore, the oscillation wavelengths of the surface emitting laser elements formed in the region 10a, the region 10b, the region 10c and the region 10d in the wafer 10 can be made approximately uniform, and the yield can be improved.

Next, a semiconductor layer above the wavelength adjustment layer 140 is formed. Specifically, on the wavelength adjustment layer 140 or the second phase adjustment layer 132, the first phase adjustment layer 131, the first upper Bragg reflection mirror 107 and the contact layer 109 are formed by a recrystal growth according to MOCVD method or MBE method.

Next, the semiconductor layer is removed by etching until a side surface of the electric current narrowing layer 108 formed in the second upper Bragg reflection mirror 106 is exposed, thereby a mesa is formed. Afterwards, from a side surface of the mesa, by selectively oxidizing surrounding area of the electric current narrowing layer 108, a selected oxidized region 108a is formed. A region which has not been selectively oxidized is an electric current narrowing region 108b. For the etching to form the mesa, a dry etching method may be used. The mesa may have an arbitrary shape, viewed from the above the mesa, other than a circle, such as an ellipse, a square, or a rectangle.

After forming the mesa, by treating by heat in steam, AlAs which becomes an electric current narrowing layer 108, a side surface of which is exposed, is oxidized from the side surface and is changed to be an insulator formed of $Al_xO_y$, or the like. Then, the selected oxidized region 108a is formed around the electric current narrowing layer 108. In this way, by forming the selected oxidized region 108a in the electric current narrowing layer 108, a central portion which is not oxidized in the electric current narrowing layer 108 becomes the electric current narrowing region 108b, and thereby a path of a driving current can be restricted to the electric current narrowing region 108b that is the central portion. Such structure is referred to as an electric current narrowing structure.

Next, a protection layer 151 of SiN (silicon nitride) is provided on a whole surface including the side surface and a top surface of the mesa. Furthermore, the region where the semiconductor layer is etched upon forming the mesa is filled with polyimide and is planarized, and thereby a resin layer 152 is formed. Afterwards, the protection layer 151 and the resin layer 152 above the contact layer 109 are removed, and an upper electrode 111 to be a p-side individual electrode is formed around a region above the contact layer 109 where laser light is emitted. On the back side of the substrate 101, a lower electrode 112 to be an n-side common electrode is formed.

In the embodiment, the side surface of the semiconductor layer which is exposed by forming the mesa or a bottom surface around the mesa is protected by forming the protection layer 151 of SiN, which is a dielectric material, and reliability of the surface emitting laser element is improved. Especially, when the semiconductor layer includes corrosion-prone Al, an effect is produced.

In the embodiment, the wavelength adjustment region 120 is arranged in the upper Bragg reflection mirror. However, the wavelength adjustment region 120 may be arranged in the lower Bragg reflection mirror.

In the usage of the atomic oscillator, a VCSEL that oscillates exactly with a desired wavelength is required. As a method of obtaining such a VCSEL oscillating exactly with a desired wavelength, a method of providing a plurality of light emitting elements, oscillation wavelengths of which are slightly different from each other, in one chip, and selecting a light emitting element emitting the desired oscillation wavelength from the plurality of light emitting elements is disclosed (See, for example, Japanese Published Patent Application No. 2013-138176). In this method, wavelength adjustment layers, film thicknesses of which are slightly different from each other, are formed in the middle of the upper DBR in order to make the oscillation wavelengths different from each other.

The wavelength adjustment layer is formed by laminating two kinds of different semiconductor materials alternately. When the entire upper DBR is formed by a semiconductor multilayered film, at an interface of two kinds of semiconductor materials forming the wavelength adjustment layers, due to a difference between band gaps of the two kinds of semiconductor materials, a barrier or the like occurs and resistance becomes great. In order to solve the problem, the method may include, for example, increasing density of an impurity element in the wavelength adjustment layer to decrease the resistance. However, in this case, there is a problem that light absorption becomes great that leads to degradation of the characteristic as the DBR and furthermore an increase of an oscillation threshold electric current of the VCSEL or the like.

Accordingly, in the surface emitting laser element, in which the DBR is formed of a semiconductor material, and the wavelength adjustment layer is provided in the middle of the DBR, the oscillation threshold electric current is desired to be small.

According to the surface emitting laser element according to the embodiment, in the surface emitting laser element, in which the DBR is formed by a semiconductor material, and the wavelength adjustment layer is provided in the middle of the DBR, the oscillation threshold electric current can be made small.

Second Embodiment

Next, a second embodiment will be described. A surface emitting laser element according to the embodiment is a surface emitting laser element of 894.6 nm using an electric current narrowing structure, as in the first embodiment. In the surface emitting laser element according to the first embodiment, the wavelength adjustment region 120 is replaced by a high refraction index layer in the upper Bragg reflection mirror, but the surface emitting laser element according to the second embodiment, the wavelength adjustment region 120 is replaced by a low refraction index layer.

The entire structure of the surface emitting laser element according to the second embodiment is the same as the structure illustrated in FIG. 1. In the embodiment, the second upper Bragg reflection mirror 106 and the first upper Bragg reflection mirror 107 are formed so that the wavelength adjustment region is replaced by a low refraction index layer in the upper Bragg reflection mirror.

Figure 5:
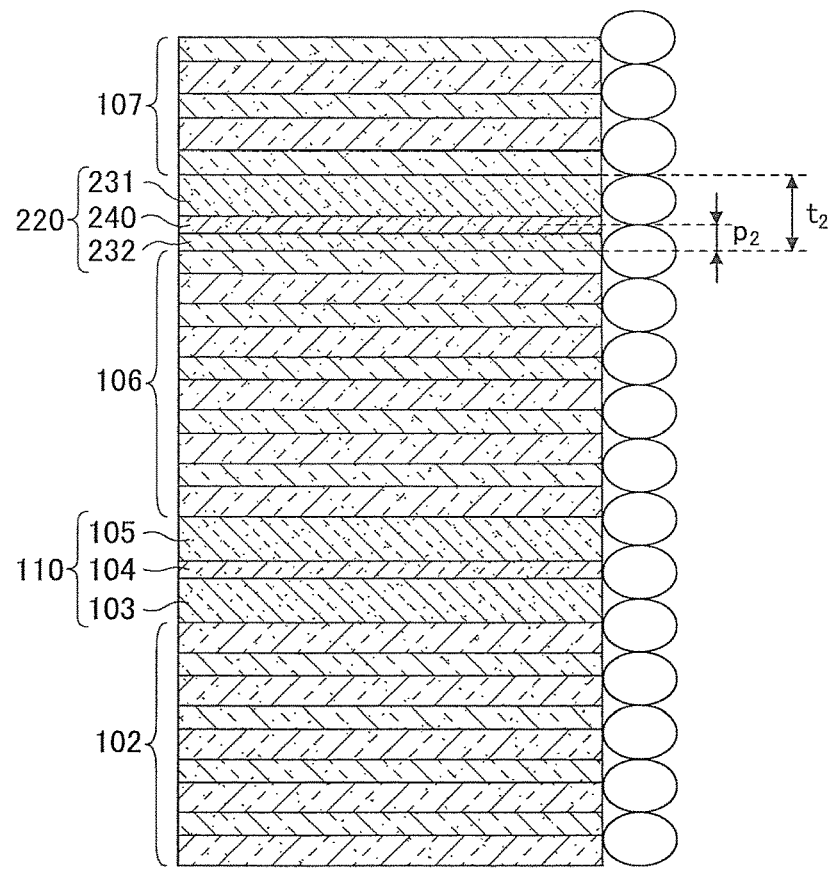
FIG. 5 is a structure diagram depicting an example of a main part of a surface emitting laser element according to a second embodiment.
Figure 6:
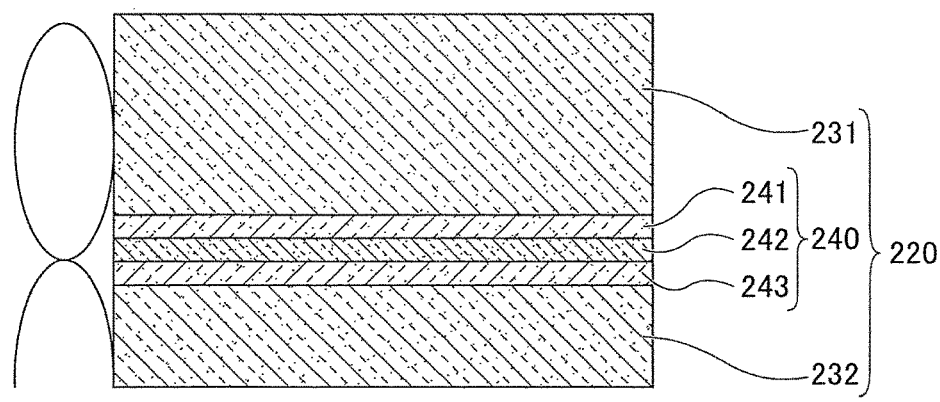
FIG. 6 is an explanatory diagram depicting an example of a wavelength adjustment region of the surface emitting laser element according to the second embodiment.

In the embodiment, as illustrated in FIG. 5 and FIG. 6, a wavelength adjustment region 220 is formed between the second upper Bragg reflection mirror 106 and the first upper Bragg reflection mirror 107. The wavelength adjustment region 220 is formed, on the second upper Bragg reflection mirror 106, from the side of the resonator region 110 in the order of a second phase adjustment layer 232, a wavelength adjustment layer 240, and a first phase adjustment layer 231. As illustrated in FIG. 5, the wavelength adjustment region 220 is formed so that an upper end of the wavelength adjustment region 220 is positioned at a node in a longitudinal mode, the lower end is positioned at an antinode in the longitudinal mode, and the wavelength adjustment layer 240 is positioned at a node in the longitudinal mode. In FIG. 5, the electric current narrowing layer 108 formed in the second upper Bragg reflection mirror 106 is omitted.

The wavelength adjustment layer 240 adjusts an oscillation wavelength in a surface emitting laser element. In the embodiment, up to three layers are provided. The wavelength adjustment layer 240 is formed by alternately laminating two kinds of semiconductor materials, etching conditions of which are different from each other. Specifically, the wavelength adjustment layer 240 is formed by alternately laminating $p^{++}$-$(Al_{0.7}Ga_{0.3})_{0.5}In_{0.5}P$ and $p^{++}$-$Al_{0.7}Ga_{0.3}As$. That is, in the wavelength adjustment layer 240, a third adjustment layer 243 formed of $p^{++}$-$(Al_{0.7}Ga_{0.3})_{0.5}In_{0.5}P$, a second adjustment layer 242 formed of $p^{++}$-$Al_{0.7}Ga_{0.3}As$, and a first adjustment layer 241 formed of $p^{++}$-$(Al_{0.7}Ga_{0.3})_{0.5}In_{0.5}P$ are laminated in order. In the embodiment, in the wavelength adjustment layer 240, as an impurity element, zinc (Zn) is doped with a density of $1\times10^{18}$ cm$^{-3}$ or more.

In the embodiment, by changing the number of layers in the wavelength adjustment layer 240, an optical thickness in the wavelength adjustment region 220 can be changed for each surface emitting laser element. Therefore, the ratio of surface emitting laser elements, an oscillation wavelength of which is the desired wavelength, obtained from a wafer can be increased, and the yield can be improved.

As illustrated in FIG. 5, in the embodiment, the wavelength adjustment region 220 is formed so that an optical thickness $t_2$ of the entire wavelength adjustment region 220 is approximately $3\lambda/4$. Moreover, in the wavelength adjustment region 220, an optical distance $p_2$ from a lower end of the wavelength adjustment region 220 to a center of the wavelength adjustment layer 240 is approximately $\lambda/4$. When the wavelength adjustment layer 240 is formed by three layers of $p^{++}$-$(Al_{0.7}Ga_{0.3})_{0.5}In_{0.5}P/p^{++}$-$Al_{0.7}Ga_{0.3}As/p^{++}$-$(Al_{0.7}Ga_{0.3})_{0.5}In_{0.5}P$, the optical distance $p_2$ to the center of the middle layer is $\lambda/4$. That is, the optical distance $p_2$ to the center of the middle layer $p^{++}$-$Al_{0.7}Ga_{0.3}As$ in the wavelength adjustment layer 240 is $\lambda/4$.

In addition, in the case of forming so that the optical thickness $t_2$ of the entire wavelength adjustment region 220 is approximately $5\lambda/4$, the wavelength adjustment layer 240 has only to be formed at a position where the optical distance $p_2$ from the lower end of the wavelength adjustment region 220 is $\lambda/4$ or $3\lambda/4$. Moreover, in the case of forming so that the optical thickness $t_2$ of the entire wavelength adjustment region 220 is approximately $7\lambda/4$, the wavelength adjustment layer 240 has only to be formed at a position where the optical distance $p_2$ from the lower end of the wavelength adjustment region 220 is any one of $\lambda/4$, $3\lambda/4$ and $5\lambda/4$.

That is, the optical thickness of the wavelength adjustment region 220 is approximately $(2N+1)\times\lambda/4$ ($N=1, 2, \ldots$), and the position of the wavelength adjustment layer 240 is from an end portion of the wavelength adjustment region 220 on the side of the resonator region 110, approximately $(2M+1)\times\lambda/4$ ($M=1, 2, \ldots$) where M is less than or equal to N−1.

In the embodiment, an optical thickness of each of the three layers of $p^{++}$-$(Al_{0.7}Ga_{0.3})_{0.5}In_{0.5}P/p^{++}$-$Al_{0.7}Ga_{0.3}As/p^{++}$-$(Al_{0.7}Ga_{0.3})_{0.5}In_{0.5}P$ forming the wavelength adjustment layer 240 is $0.05\lambda$. Therefore, when a layer number of the adjustment layers in the wavelength adjustment layer 240 is changed, an interval of oscillation wavelengths in the surface emitting laser element is 1 nm.

In addition, any of the refraction indices of $p^{++}$-$(Al_{0.7}Ga_{0.3})_{0.5}In_{0.5}P$ and $p^{++}$-$Al_{0.7}Ga_{0.3}As$ forming the wavelength adjustment layer 240 is 3.1. Therefore, compared with the surface emitting laser element according to the first embodiment, a refraction index difference is small. In this way, when the refraction index difference between two kinds of materials forming the wavelength adjustment layer 240 is small, scattering loss in the wavelength adjustment layer 240 can be made small.

Features in the second embodiment other than those described as above are the same as the first embodiment.

Third Embodiment

Figure 7:
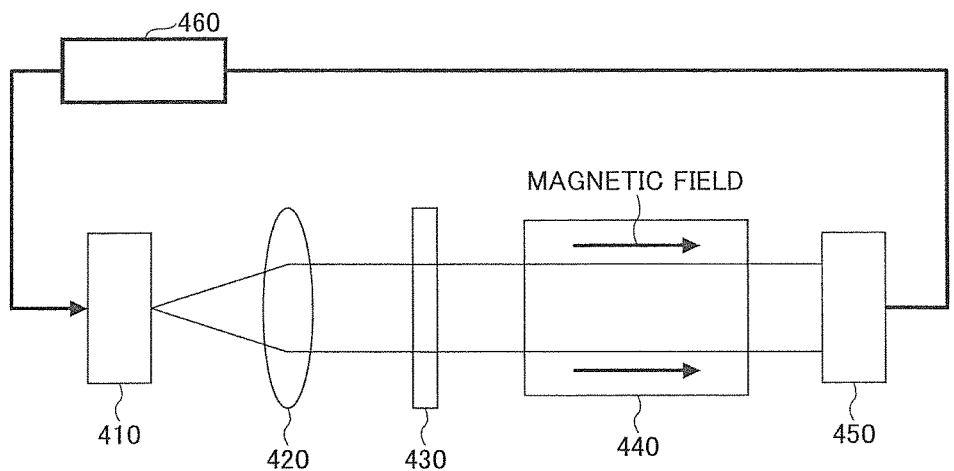
FIG. 7 is a structure diagram depicting an example of an atomic oscillator according to a third embodiment.

Next, the third embodiment will be described. The embodiment relates to an atomic oscillator using the surface emitting laser element according the first embodiment or the second embodiment. With reference to FIG. 7, the atomic oscillator according to the embodiment will be described. The atomic oscillator according to the embodiment is a small-sized atomic oscillator of the CPT type, including a light source 410, a collimating lens 420, a quarter-wave plate 430, an alkali metal cell 440, a light detector 450 and a modulator 460 (See, for example, Comprehensive Microsystems, Vol. 3, pp. 571-612 and Japanese Published Patent Application No. 2009-188598).

In the atomic oscillator according to the embodiment, by injecting lights with two different wavelengths out of lights including a side band emitted from the surface emitting laser into the alkali metal cell 440, an oscillation frequency is controlled according to a light absorption characteristic due to a quantum interference effect by two kinds of resonance lights.

For the light source 410, the surface emitting laser element is made according to the first embodiment or the second embodiment. In the alkali metal cell 440, alkali atoms of cesium (Cs) are encapsulated, and the transition of the D1 line is used. For the light detector 450, a photodiode is used.

In the atomic oscillator according to the embodiment, light emitted from the light source 410 is irradiated to the alkali metal cell 440 in which the cesium atom gas is encapsulated, thereby electrons in the cesium atom are excited. Light having passed through the alkali metal cell 440 is detected by the light detector 450. A signal detected by the light detector 450 is fed back to the modulator 460. The modulator modulates the surface emitting laser element at the light source 410.

Figure 8:
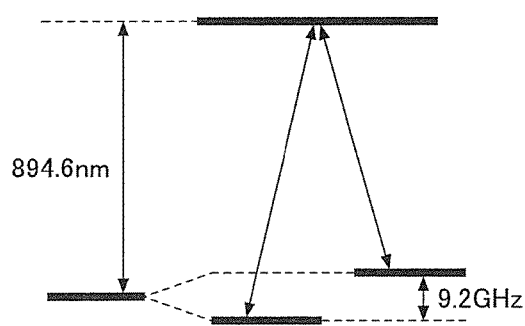
FIG. 8 is an explanatory diagram depicting an example of atomic energy levels for explaining a CPT type atomic oscillator.
Figure 9:
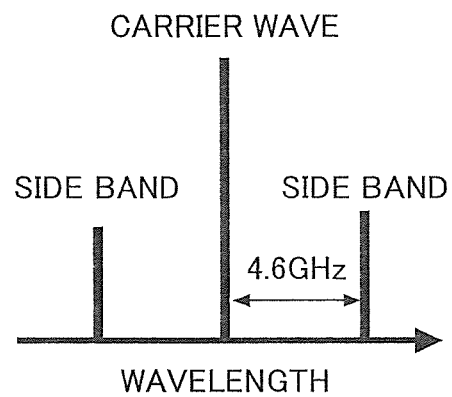
FIG. 9 is an explanatory diagram depicting output wavelengths upon modulation of a surface emitting laser.
Figure 10:
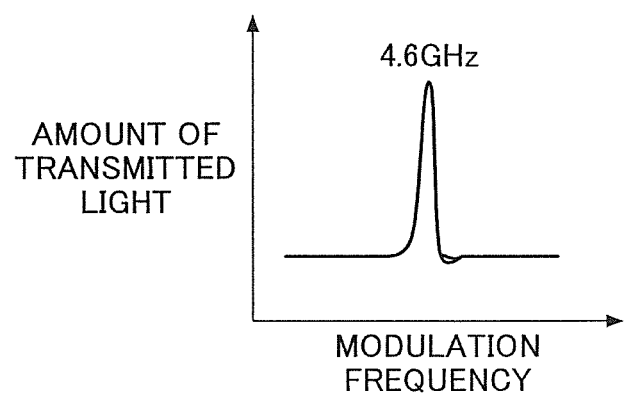
FIG. 10 is a diagram depicting an example of a correlation between a modulation frequency and an amount of transmitted light.

FIG. 8 illustrates a structure of atomic energy level related to the CPT method, which uses a property that when electrons are simultaneously excited from two ground states to an excited state, respectively, a light absorption rate decreases. In the surface emitting laser, there is an element, a wavelength of a carrier wave of which is close to 894.6 nm. The wavelength of the carrier wave can be tuned by changing temperature or output power of the surface emitting laser. As shown in FIG. 9, side bands appear on both sides of the carrier wave by the modulation. In the third embodiment, the surface emitting laser is modulated with a frequency of 4.6 GHz, so that a frequency difference between the side bands corresponds to the eigen frequency of the cesium atom, i.e. 9.2 GHz. As shown in FIG. 10, the amount of laser light transmitted through the excited cesium atom gas becomes maximum value when the frequency difference between the side bands corresponds to the eigen frequency difference of the cesium atom. The signal detected at the light detector 450 is fed back at the modulator 460 so that the output power from the light detector 450 is maintained at the maximum value. Accordingly, the modulation frequency of the surface emitting laser at the light source 410 is tuned. Since the eigen frequency of the atom is stable, a value of the modulation frequency is stable. This information is extracted as an output. In the case where the wavelength is 894.6 nm, a light source having a range of wavelength of light within ±1 nm is required. More preferably, a light source having a range of wavelength of light within ±0.3 nm is required (See, for example, Proc. of SPIE, Vol. 6132 613208-1 (2006)).

The atomic oscillator according to the third embodiment uses the surface emitting laser element according to the first embodiment or the second embodiment. For the surface emitting laser, due to the variation of layer thickness in the crystal growth, it is difficult to obtain a uniform oscillation wavelength within ±1 nm, as described above. However, oscillation wavelengths of the surface emitting laser elements according to the first embodiment or the second embodiment can be made uniform with a high yield in a wafer. Accordingly, a lot of surface emitting laser elements of the oscillation wavelength close to 894.6 nm can be obtained, i.e. the yield of surface emitting laser elements, in which an exact oscillation wavelength is required, is improved, and an atomic oscillator can be produced and provided with low cost.

Moreover, in the third embodiment, cesium (Cs) is used as the alkali metal and the surface emitting laser, a wavelength of which is 894.6 nm, is employed so as to use the transition of the D1 line. However, a surface emitting laser, a wavelength of which is 852.3 nm, may be employed so as to use the transition of the D2 line. Moreover, rubidium (Rd) may be used as the alkali metal. In this case, a surface emitting laser, a wavelength of which is 795.0 nm, and a surface emitting laser, a wavelength of which is 780.2 nm may be employed so as to use the transition of the D1 and D2 lines, respectively. A material composition of the active layer or the like may be designed according to the wavelength. Moreover, the modulation frequencies in the case of using rubidium are 3.4 GHz and 1.5 GHz for rubidium 87 ($^{87}Rb$) and rubidium 85 ($^{85}Rb$), respectively. Also for the above wavelengths, a light source having a range of wavelength of light within ±1 nm is required.

Further, the present invention is not limited to these embodiments, but various variations and modifications may be made without departing from the scope of the present invention. Moreover, in the embodiments of the present invention, the case where the surface emitting laser element is applied to the atomic oscillator is explained, but the surface emitting laser according to the first embodiment or the second embodiment may be applied to another apparatus or the like which requires light with a predetermined wavelength, such as a gas sensor. In such a case, in these apparatuses or the like, by using the surface emitting laser light with a predetermined wavelength depending on the use, the same effect is obtained.

What is claimed is:

1. A surface emitting laser element comprising:
a lower Bragg reflection mirror;
an upper Bragg reflection mirror; and
a resonator region formed between the lower Bragg reflection mirror and the upper Bragg reflection mirror, and including an active layer,
wherein a wavelength adjustment region is formed in the lower Bragg reflection mirror or the upper Bragg reflection mirror,
wherein the wavelength adjustment region includes a second phase adjustment layer, a wavelength adjustment layer and a first phase adjustment layer, arranged in this order from a side where the resonator region is formed,
wherein an optical thickness of the wavelength adjustment region is approximately $(2N+1) \times \lambda/4$, and
wherein the wavelength adjustment layer is formed at a position where an optical distance from an end of the wavelength adjustment region on the side where the resonator region is formed is approximately $M \times \lambda/2$,
where $\lambda$ is a wavelength of emitted light, M and N are positive integers, and M is less than or equal to N.

2. A surface emitting laser element comprising:
a lower Bragg reflection mirror;
an upper Bragg reflection mirror; and
a resonator region formed between the lower Bragg reflection mirror and the upper Bragg reflection mirror, and including an active layer,
wherein a wavelength adjustment region is formed in the lower Bragg reflection mirror or the upper Bragg reflection mirror,
wherein the wavelength adjustment region includes a second phase adjustment layer, a wavelength adjustment layer and a first phase adjustment layer, arranged in this order from a side where the resonator region is formed,
wherein an optical thickness of the wavelength adjustment region is approximately $(2N+1) \times \lambda/4$, and
wherein the wavelength adjustment layer is formed at a position where an optical distance from an end of the wavelength adjustment region on the side where the resonator region is formed is approximately $(2M+1) \times \lambda/4$,
where $\lambda$ is a wavelength of emitted light, M and N are positive integers, and M is less than or equal to N−1.

3. A surface emitting laser element comprising:
a lower Bragg reflection mirror;
an upper Bragg reflection mirror; and
a resonator region formed between the lower Bragg reflection mirror and the upper Bragg reflection mirror, and including an active layer,
wherein a wavelength adjustment region is formed in the lower Bragg reflection mirror or the upper Bragg reflection mirror,
wherein the wavelength adjustment region includes a second phase adjustment layer, a wavelength adjustment ment layer and a first phase adjustment layer, arranged in this order from a side where the resonator region is formed,
wherein an end of the wavelength adjustment region is positioned at an antinode of a longitudinal mode and another end is positioned at a node of the longitudinal mode, and
wherein the wavelength adjustment layer is positioned at a node of the longitudinal mode.

4. The surface emitting laser element according to claim 1,
wherein the wavelength adjustment layer is formed by laminating two different kinds of materials.

5. The surface emitting laser element according to claim 1,
wherein the wavelength adjustment layer is formed by laminating two different kinds of materials, and
wherein one of the two different kinds of materials is GaInP, and the other is GaAsP or GaAs.

6. The surface emitting laser element according to claim 2,
wherein the wavelength adjustment layer is formed by laminating two different kinds of materials, and
wherein one of the two different kinds of materials is AlGaInP, and the other is AlGaAs.

7. The surface emitting laser element according to claim 1,
wherein the lower Bragg reflection mirror and the upper Bragg reflection mirror are formed of a semiconductor material.

8. The surface emitting laser element according to claim 1,
wherein a density of an impurity element in the wavelength adjustment layer is greater than or equal to $1 \times 10^{18}$ cm$^{-3}$.

9. The surface emitting laser element according to claim 1,
wherein the wavelength of the emitted light is 780.2 nm, 795.0 nm, 852.3 nm or 894.6 nm.

10. An atomic oscillator, comprising:
the surface emitting laser element according to claim 1;
an alkali metal cell configured to encapsulate alkali metal; and
a light detection unit configured to detect light transmitted through the alkali metal cell, the light being emitted from a surface emitting laser of the surface emitting laser element to the alkali metal cell,
wherein an oscillation frequency is controlled according to a light absorption characteristic of a quantum interference effect for two kinds of resonant lights, by injecting lights with two different wavelengths out of lights including sidebands emitted from the surface emitting laser element into the alkali metal cell.

11. The atomic oscillator according to claim 10,
wherein the lights with two different wavelengths are lights of the sidebands emitted from the surface emitting laser.

12. The atomic oscillator according to claim 10,
wherein the alkali metal is rubidium or cesium.

* * * * *